(12) United States Patent
Sasaoka

(10) Patent No.: US 10,199,550 B2
(45) Date of Patent: Feb. 5, 2019

(54) LIGHT-EMITTING DEVICE

(71) Applicant: NICHIA CORPORATION, Anan-shi, Tokushima (JP)

(72) Inventor: Shimpei Sasaoka, Itano-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/610,524

(22) Filed: May 31, 2017

(65) Prior Publication Data

US 2017/0345986 A1 Nov. 30, 2017

(30) Foreign Application Priority Data

May 31, 2016 (JP) .................................. 2016-109391

(51) Int. Cl.
*H01L 33/62* (2010.01)
*H01L 33/48* (2010.01)
*H01L 33/56* (2010.01)

(52) U.S. Cl.
CPC ............ *H01L 33/62* (2013.01); *H01L 33/483* (2013.01); *H01L 33/56* (2013.01); *H01L 2224/16245* (2013.01); *H01L 2924/181* (2013.01)

(58) Field of Classification Search
CPC ............. H01L 21/67721; H01L 23/495; H01L 23/49537; H01L 23/49575
See application file for complete search history.

(56) References Cited

U.S. PATENT DOCUMENTS

| 2008/0298063 | A1* | 12/2008 | Hayashi | ............ B29C 45/14655 362/249.01 |
| 2009/0026480 | A1* | 1/2009 | Hayashi | .................. H01L 24/48 257/98 |
| 2010/0025709 | A1 | 2/2010 | Koseki et al. | |
| 2011/0233571 | A1 | 9/2011 | Park | |
| 2012/0080674 | A1 | 4/2012 | Shimizu et al. | |
| 2014/0183574 | A1 | 7/2014 | Nakabayashi et al. | |
| 2016/0072028 | A1 | 3/2016 | Naka | |
| 2016/0079500 | A1* | 3/2016 | Aoki | ....................... H01L 33/62 257/98 |

(Continued)

FOREIGN PATENT DOCUMENTS

JP 2008-084943 A 4/2008
JP 2009-065002 A 3/2009

(Continued)

*Primary Examiner* — Jay C Chang
*Assistant Examiner* — Mikka Liu
(74) *Attorney, Agent, or Firm* — Foley & Lardner LLP

(57) ABSTRACT

A light-emitting device includes: a resin package including: a first lead, a second lead, and a resin portion, wherein each of the first lead and the second lead has a top surface and a bottom surface and comprises a metal layer formed at least at the top surfaces; a light-emitting element electrically connected to the first lead and the second lead; and a protection element located on a first surface portion of the top surface of the first lead. The first lead includes: a first lateral portion and at least one second lateral portion. A second surface portion is formed at the top surface of the first lead between the protection element and at least one of the first lateral portion and the at least one second lateral portion, the second surface portion being embedded in the resin portion and extending in a height direction.

14 Claims, 11 Drawing Sheets

(56) References Cited

U.S. PATENT DOCUMENTS

2017/0110637 A1* 4/2017 Lim .................. H01L 23/49537

FOREIGN PATENT DOCUMENTS

| | | |
|---|---|---|
| JP | 2010-034292 A | 2/2010 |
| JP | 2011-119557 A | 6/2011 |
| JP | 2011-176256 A | 9/2011 |
| JP | 2011-205100 A | 10/2011 |
| JP | 2012-109352 A | 6/2012 |
| JP | 2013-058782 A | 3/2013 |
| JP | 2014-130973 A | 7/2014 |
| JP | 2016-054251 A | 4/2016 |

* cited by examiner

LIGHT-EMITTING DEVICE

CROSS-REFERENCE TO RELATED APPLICATION

This application claims priority to Japanese Patent Application No. 2016-109391, filed on May 31, 2016, the disclosure of which is hereby incorporated by reference in its entirety.

BACKGROUND

The present disclosure relates to a light-emitting device.

Light-emitting devices using light-emitting elements such as LEDs are capable of achieving high light emission efficiency, and are therefore used in many appliances, including backlights of displays, etc., and lighting fixtures.

Japanese Patent Publication No. 2010-34292 discloses a light-emitting device having a resin package including a pair of a positive lead and a negative lead and a resin portion, and electronic components such as a light-emitting element and a protection element incorporated in the resin package. Moreover, Japanese Patent Publication No. 2010-34292 discloses a light-emitting element, having a positive electrode and a negative electrode on the same side, flip-chip-bonded on the pair of a positive lead and a negative lead.

The resin package includes a lead frame including a plurality of leads connected to one another via connecting portions, and the resin package includes a resin portion formed to be integral with the lead frame, thus providing a lead frame with a resin portion integrated as a single piece via the connecting portions. Then, the lead frame with the resin portion is severed at the connecting portions, thereby producing individual light-emitting devices.

SUMMARY

In such a light-emitting device, interfaces between a resin portion and leads are formed on a lateral surface or on the bottom surface. Due to this structure, flux contained in a bonding member such as a solder may enter the device from outside via the resin portion-lead interfaces, and there is a need to further improve the reliability of the light-emitting device.

Certain embodiments of the present disclosure provides a light-emitting device having a high reliability.

According to one embodiment, a light-emitting device includes: a resin package including a first lead, a second lead and a resin portion, the first lead and the second lead each having a top surface and a bottom surface and including a metal layer formed at least on the top surface, the first lead, the second lead and the resin portion together defining a first recessed portion, wherein a part of the top surface of the first lead and a part of the top surface of the second lead are exposed on a bottom surface of the first recessed portion, and a part of a bottom surface of the first lead and a part of a bottom surface of the second lead are exposed on the resin portion; a light-emitting element located in the first recessed portion of the resin package, the light-emitting element being electrically connected to the first lead and the second lead with each other; a protection element embedded in the resin portion and located on a first surface portion of the top surface of the first lead; and a second surface portion embedded in the resin portion and extending in a height direction with respect to the first surface portion. The resin package has at least one lateral surface. The first lead includes a first lateral portion located on a side that is adjacent to the second lead, and at least one second lateral portion, at least one part of which is exposed from the resin portion on the at least one lateral surface of the resin package. The second surface portion is located, on the top surface of the first lead, between the protection element and at least one of the first lateral portion and the at least one second lateral portion.

According to light-emitting devices of the present disclosure, it is possible to obtain a light-emitting device having a high reliability.

DETAILED DESCRIPTION

A light-emitting device according to embodiments of the present disclosure will now be described in detail with reference to the drawings. The following embodiments are illustrative, and the light-emitting device of the present disclosure is not limited thereto. In the following description, terms representing particular directions or positions (e.g., "upper", "lower", "right" and "left", and other terms including these words) may be used. These terms are used merely for the sake of ease of explanation, representing relative directions and relative positions in the figures. The size, the positional relationship, etc., of the components shown in the figures may be exaggerated for the sake of ease of explanation, and may not represent the actual size in an actual light-emitting device or the actual size relationship between components in an actual light-emitting device.

In the embodiment described below, the term "stepped portion" is used, referring to a structure that has a second surface portion and discourages the entrance of flux, or the like. The term "face", as used in the present disclosure, refers to a surface or member located so as to be in front of the subject member or surface, and the term does not only encompass cases in which the surface or member are located so as to be directly in front of the subject member or surface but also includes cases in which they are located so as to partly face each other.

Figure 1A:
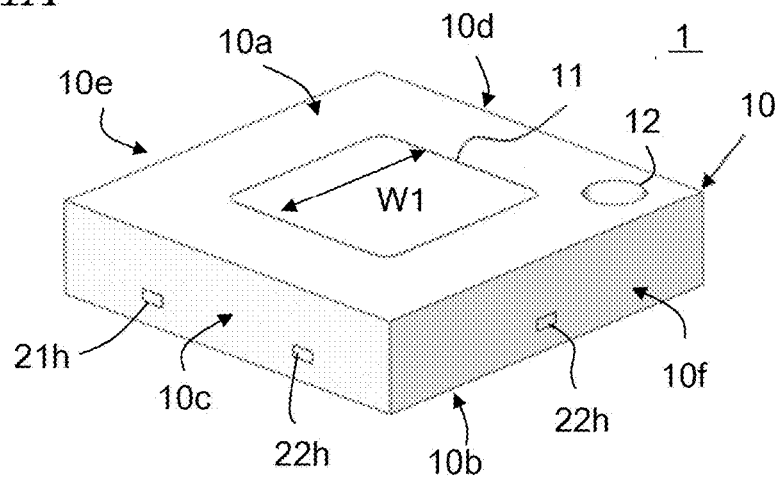
FIG. 1A is a schematic perspective view of a light-emitting device according to an embodiment of the present disclosure, as seen from the top surface side.
Figure 1B:
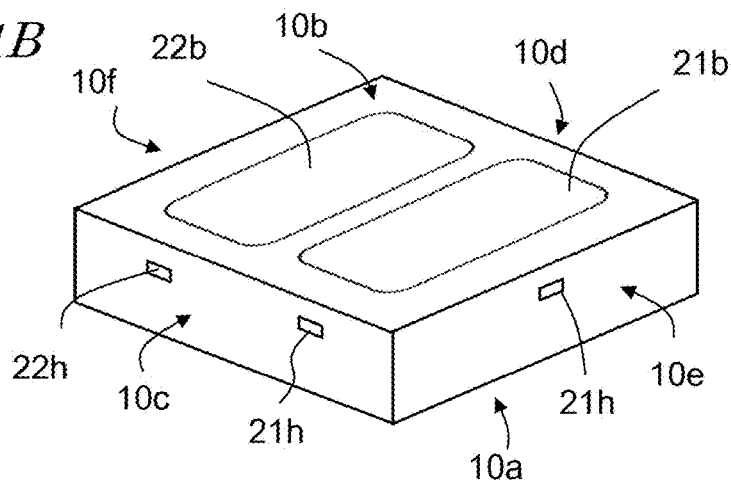
FIG. 1B is a schematic perspective view of the light-emitting device according to the embodiment of the present disclosure, as seen from the bottom surface side.
Figure 1C:
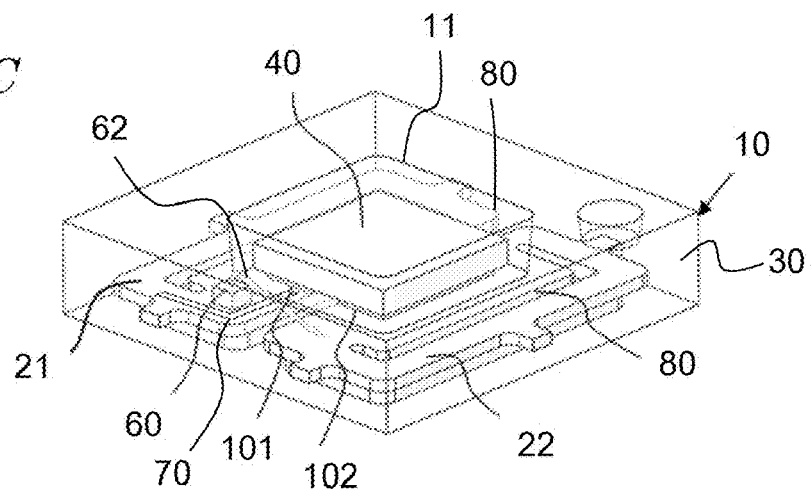
FIG. 1C is a schematic perspective transparent view of the light-emitting device according to the embodiment of the present disclosure, as seen from the top surface side.
Figure 1D:
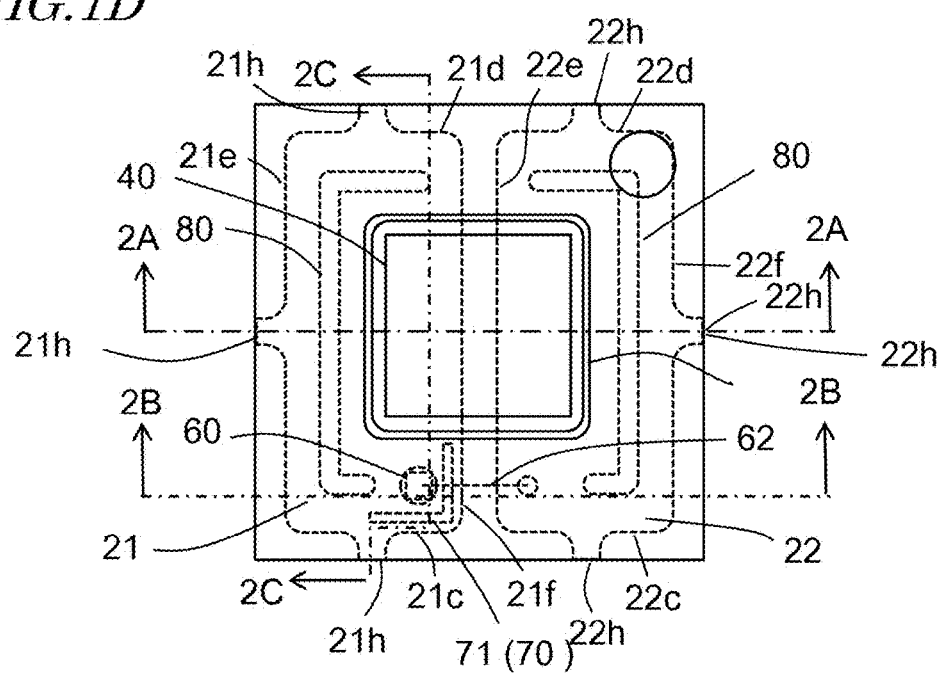
FIG. 1D is a schematic top transparent view of the light-emitting device according to the embodiment of the present disclosure.
Figure 2A:
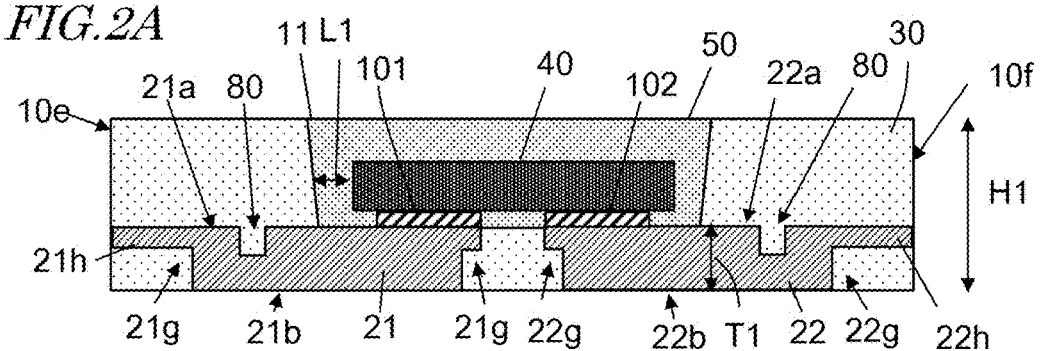
FIG. 2A is a schematic cross-sectional view of the light-emitting device taken along line 2A-2A of FIG. 1D.
Figure 2B:
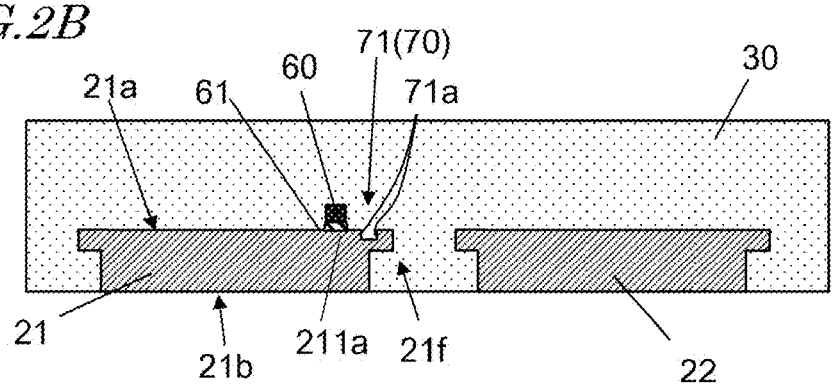
FIG. 2B is a schematic cross-sectional view of the light-emitting device taken along line 2B-2B of FIG. 1D.
Figure 2C:
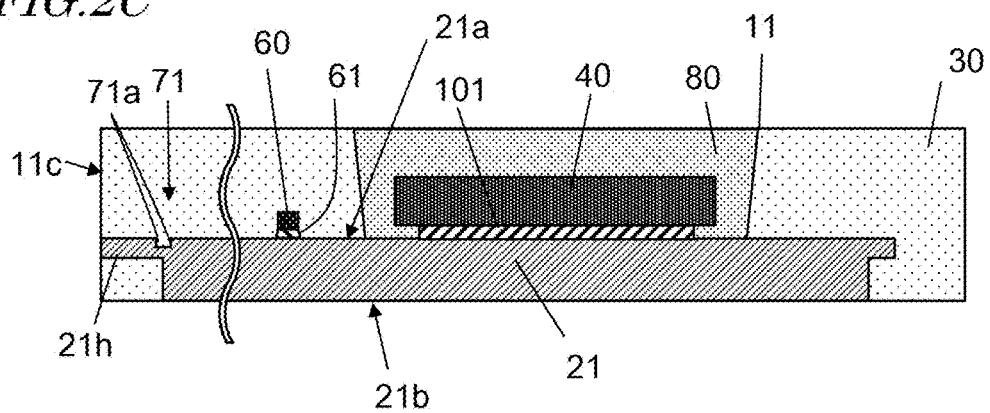
FIG. 2C is a schematic cross-sectional view of the light-emitting device taken along line 2C-2C of FIG. 1D.

FIG. 1A and FIG. 1B are schematic perspective views of a light-emitting device 1, as seen from the top surface side and from the bottom surface side, respectively, and FIG. 1C is a schematic transparent view of the light-emitting device 1, as seen from the top surface side. FIG. 1D is a schematic top transparent view showing the light-emitting device 1. FIG. 2A to FIG. 2C are schematic cross-sectional views of the light-emitting device 1 taken along line 2A-2A, line 2B-2B and line 2C-2C of FIG. 1D, respectively.

The light-emitting device 1 includes a resin package 10, a light-emitting element 40, a protection element 60, and a stepped portion 70 having a second surface portion 71a. The components will now be described in detail.

Resin Package 10

As shown in FIG. 1C, FIG. 1D and FIG. 2A to FIG. 2C, the resin package 10 includes a resin portion 30, a first lead 21 and a second lead 22. The resin portion 30 is formed to be integral with the first lead 21 and the second lead 22. The first lead 21 has a top surface 21a, and a bottom surface 21b located on the opposite side from the top surface 21a, and the second lead 22 has a top surface 22a and a bottom surface 22b located on the opposite side from the top surface 22a. The first lead 21 and the second lead 22 are arranged next to each other with a predetermined interval therebetween so that the bottom surface 21b and the bottom surface 22b are substantially coplanar with each other. The light-emitting device 1 includes the protection element 60 located on a first surface portion 211a of the first lead 21.

The resin package 10 has a top surface 10a, and a bottom surface 10b located opposite from the top surface 10a. As shown in FIG. 1A, in the present embodiment, the resin package 10 has a substantially rectangular parallelepiped shape. Therefore, the resin package 10 has an outer lateral surface 10c, an outer lateral surface 10d located opposite from the outer lateral surface 10c, an outer lateral surface 10e, and an outer lateral surface 10f located opposite from the outer lateral surface 10e. The top surface 10a and the bottom surface 10b may have an appropriate shape in addition to a rectangular shape. That is, the resin package 10, as seen from above, may have a substantially triangular shape, a substantially rectangular shape, a substantially pentagonal shape, a substantially hexagonal shape or any other polygonal shape, or a shape with a curve such as a circular shape or an elliptical shape.

The resin package 10 is provided with a first recessed portion 11 having an opening on the top surface 10a. In the present embodiment, the first recessed portion 11 has a truncated pyramid shape with a rectangular opening, as seen from above.

A portion of the top surface 21a of the first lead 21 and a portion of the top surface 22a of the second lead 22 are exposed on the bottom surface of the first recessed portion 11 of the resin package 10.

The lateral surface of the first recessed portion 11 is preferably flared outward in the direction from the bottom surface of the first recessed portion 11 toward an open end of the opening of the first recessed portion 11. This allows light from the light-emitting element 40 located in the first recessed portion 11 to be efficiently reflected toward the open end of the opening. However, the lateral surface of the first recessed portion 11 may be perpendicular to the top surface 10a. In such a case, the area of the opening of the first recessed portion 11 can be made smaller, and the light-emitting surface of the light from the light-emitting device 1 can be made smaller, so that the light-emitting device 1 can be similar to a point light source.

One side of the outer lateral surface of the resin package 10 is preferably 1500 μm or more and 3500 μm or less, and the width W1 of the opening of the first recessed portion 11 is 800 μm or more and 1800 μm or less. Each side of the light-emitting element 40 located in the first recessed portion 11 is preferably 650 μm or more and 1400 μm or less, as seen from above. Moreover, a distance L1 between the lateral surface of the first recessed portion 11 and the lateral surface of the light-emitting element 40 is preferably 50 μm or more and 100 μm or less. Thus, light emitted from the light-emitting device becomes a point light source, and the focus of the light emitted from the light-emitting device can be precisely adjusted by using a lens. The ratio between the area of the outline of the resin package 10 and the area of the opening of the first recessed portion 11, as seen from above, is 1:0.6 or more and 1:0.8 or less. Then, the resin portion 30 of the resin package 10 covers the most part of the first lead 21 and the second lead 22, thereby reducing the amount of deformation of the first lead 21 and the second lead 22 even when such deformation occurs due to heat.

An identification mark, such as a cathode mark representing the polarity of the first lead 21 and the second lead 22, may be provided on the top surface 10a of the resin package 10 or on the bottom surface of the first lead 21 and the second lead 22.

First Lead 21, Second Lead 22

The first lead 21 and the second lead 22 are conductive and each serve as an electrode for supplying power to the light-emitting element 40, the protection element 60, etc. The light-emitting device 1 may include a third lead, in addition to the first lead 21 and the second lead 22. The third lead may serve as an electrode or serve as a heat dissipating member having a high heat conductivity. The light-emitting element 40 may be located on the top surface of one of the first lead 21, the second lead 22 and the third lead, or may be arranged across two of the leads. The light-emitting device 1 may have three or more leads.

As shown in FIG. 1B, a portion of the bottom surface 21b of the first lead 21 and a portion of the bottom surface 22b of the second lead 22 are exposed on the bottom surface 10b of the resin package 10. Particularly, it is preferred that areas of the bottom surfaces that are located opposite from areas of the top surface 21a of the first lead 21 and the top surface 22a of the second lead 22 on which the light-emitting element 40 is located are exposed on the bottom surface 10b. Thus, it is possible to efficiently dissipate heat from the light-emitting element 40 to the outside. As a result, in cases where the light-emitting element 40 is repeatedly turned on and off, for example, it is possible to more easily control the expansion of the first lead 21 and the second lead 22 due to heat.

As shown in FIG. 1D, the first lead 21 has a substantially rectangular shape, as seen from above. The rectangular shape is defined by lateral portions 21c, 21d, 21e and 21f. An edge groove 21g is provided along the lateral portions 21c, 21d, 21e and 21f, on the bottom surface 21b side of the lateral portions 21c, 21d, 21e and 21f. An extension 21h is located near the center along each of the lateral portions 21c, 21d and 21e, as seen from above. The end surfaces of the extensions 21h of the lateral portions 21c, 21d and 21e are respectively exposed on the outer lateral surfaces 10c, 10d and 10e of the resin package 10. The extensions 21h respectively extend from the main part of the first lead 21 toward the outer lateral surface 10c, 10d, 10e of the resin package 10. The edge groove 21g can be formed by an etching process, a pressing process, or the like.

Similarly, the second lead 22 has a substantially rectangular shape, as seen from above. The rectangular shape is defined by lateral portions 22c, 22d, 22e and 22f. An edge groove 22g is provided along the lateral portions 22c, 22d, 22e and 22f of the bottom surface 22b. An extension 22h is located near the center along each of the lateral portions 22c, 22d and 22f, as seen from above. The end surfaces of the extensions 22h of the lateral portions 22c, 22d and 22f are exposed on the outer lateral surfaces 10c, 10d and 10f of the resin package 10. The extension 22h extends from the main part of the second lead 22 toward the outer lateral surface 10c, 10d, 10f of the resin package 10. As shown in FIG. 1D, the lateral portion 21f of the first lead 21 faces the lateral portion 22e of the second lead 22. In an embodiment to be described below, the lateral portion 21f serves as a first lateral portion, and the lateral portions 21c, 21d and 21e each serves as a second lateral portion.

The edge grooves 21g and 22g on the first lead 21 and the second lead 22 are provided for the purpose of, for example, improving the adhesion of the resin portion 30 with the first lead 21 and the second lead 22. They also serve to extend the path for flux to possibly enter the device via the interfaces between the first lead 21 and the second lead 22 and the resin portion 30, as compared with a case in which the edge grooves 21g and 22g are absent, thereby making it less likely that flux reaches the light-emitting element 40 and the protection element 60.

A plurality of extensions 21h and 22h are provided in a lead frame, each being a part of a connecting portion for connecting the first lead 21 and the second lead 22 to the frame. With a plurality of first leads 21 and a plurality of second leads 22 being held in a lead frame via connecting portions, the resin portions 30 are formed to be integral with each of the first leads 21 and each of the second leads 22. Thereafter, the connecting portions in the lead frame are cut, thereby producing individual light-emitting devices 1. Thus, the extensions 21h and 22h are exposed on the outer lateral surfaces 10c, 10d, 10e and 10f of the resin package 10.

Figure 2D:
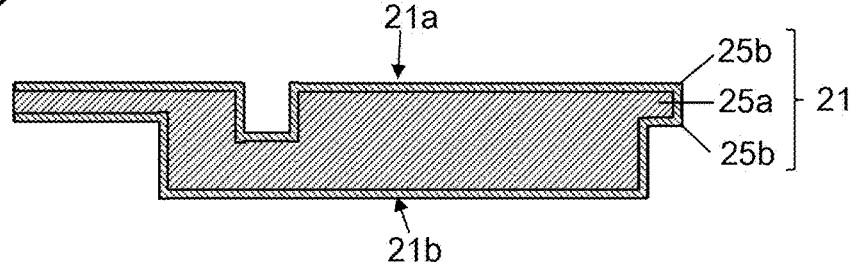
FIG. 2D is a schematic cross-sectional view of a first lead taken along line 2A-2A of FIG. 1D.

FIG. 2D shows a schematic cross-sectional view of the first lead 21 taken along line 2A-2A of FIG. 1D. The first lead 21 and the second lead 22 each include a base material 25a, and a metal layer 25b covering the base material 25a. For example, the base material 25a contains a metal such as copper, aluminum, gold, silver, iron, nickel or an alloy thereof, phosphor bronze, copper containing iron. The base material 25a may have a single-layer structure or a layered structure (e.g., a clad material). Particularly, copper is preferably used for the base material 25a. The metal layer 25b is a plated layer, for example. For example, the metal layer 25b contains silver, aluminum, nickel, palladium, rhodium, gold, copper, or an alloy thereof. The first lead 21 and the second lead 22 may include an area where the metal layer 25b is absent.

Resin Portion 30

The resin portion 30 is formed to be integral with the first lead 21 and the second lead 22, forming a package on which the light-emitting element 40 is to be mounted. A thermosetting resin or a thermoplastic resin can be used for a base resin of the resin portion 30, for example. Specifically, examples of the base resin include an epoxy resin composition, a silicone resin composition, a modified epoxy resin composition such as a silicone-modified epoxy resin, a modified silicone resin composition such as epoxy-modified silicone resin, unsaturated polyester resin, saturated polyester resin, a polyimide resin composition, a modified polyimide resin composition, polyphthalamide (PPA), polycarbonate resin, polyphenylene sulfide (PPS), a liquid crystal polymer (LCP), a resin such as an ABS resin, a phenolic resin, an acrylic resin and a PBT resin. Particularly, it is preferred that a thermosetting resin is contained.

The resin portion 30 preferably further contains a light-reflecting substance. The light-reflecting substance may be titanium oxide, silicon oxide, zirconium oxide, potassium titanate, aluminum oxide, zinc oxide, aluminum nitride, boron nitride, mullite, etc. Because the light-reflecting substance is contained, it is possible to efficiently reflect light from the light-emitting element 40. When titanium oxide is used, for example, titanium oxide is preferably contained in an amount of 20 wt % or more and 60 wt % or less, and more preferably 25 wt % or more and 55 wt % or less, with respect to the total weight of the resin portion 30. The resin portion 30 preferably has a reflectance of 60% or more, and more preferably 90% or more, for light from the light-emitting element 40.

Light-Emitting Element 40

The light-emitting element 40 may be a semiconductor light-emitting element such as a light-emitting diode element. Particularly, the light-emitting element 40 is preferably a light-emitting element of a nitride semiconductor ($In_xAl_yGa_{1-x-y}N$, $0 \le x$, $0 \le y$, $x+y \le 1$) capable of emitting light of ultraviolet to visible range. A single light-emitting device may include three light-emitting elements 40 each emitting blue light, green light and red light, for example, or may include two light-emitting elements 40 each emitting blue light and green light.

The first lead 21 and the second lead 22 are each connected to an electrode of the light-emitting element 40 via a conductive member. The conductive member may be, for example, a solder such as: a tin-bismuth-based solder, a tin-copper-based solder, a tin-silver-based solder, a gold-tin-based solder; a conductive paste that contains silver, gold, palladium, or the like; bumps; an anisotropic conductive material; a brazing material such as a low-melting-point metal; or the like. When a flux-containing solder is used as the conductive member, flux is cleaned before the light-emitting element 40 is mounted.

Among others, a eutectic alloy of which gold and tin are the major components is particularly preferred as the conductive member.

Protection Element 60

The light-emitting device 1 includes the protection element 60 in order to improve the electrostatic voltage resistance. The protection element 60 may be any of various types of protection elements used for ordinary light-emitting devices. For example, the protection element 60 may be a Zener diode. In the light-emitting device 1, the protection element 60 and the light-emitting element 40 are connected in series with each other.

The protection element 60 is located on the first surface portion 211a of the top surface 21a of the first lead 21 and is embedded in the resin portion 30 of the resin package 10. Thus, there is no need to provide an area for the protection element 60 inside the first recessed portion 11 of the resin package 10, making it possible to reduce the size of the opening of the first recessed portion 11 and thus to realize a small light-emitting device. Since the protection element 60 is not located in the first recessed portion 11, light from the light-emitting element 40 is not absorbed by the protection element 60, and it is therefore possible to realize a light-emitting device having high light extraction efficiency.

One of the two terminals of the protection element 60 is electrically connected to the first surface portion 211a of the top surface 21a of the first lead 21 via a bonding member 61. The bonding member may be, for example: a solder such as a tin-bismuth-based solder, a tin-copper-based solder, a tin-silver-based solder, a gold-tin-based solder; a conductive paste that contains silver, gold, palladium, or the like; bumps; an anisotropic conductive material; a brazing material such as a low-melting-point metal; or the like. When a flux-containing solder is used as the bonding member 61, flux is cleaned before the protection element 60 is mounted. The other terminal is connected to the top surface 22a of the second lead 22 via a wire 62, for example.

Before the formation of the resin portion 30, the protection element 60 is located on an area of the first lead 21 where the resin portion 30 is to be formed via the bonding member 61 therebetween.

First Surface Portion 211a, Second Surface Portion 71a, Stepped Portion 70

The top surface 21a of the first lead 21 has the first surface portion 211a, on which the protection element 60 is to be mounted. That is, the first surface portion 211a is a part of the top surface 21a of the first lead 21. In an embodiment to be described below, the first surface portion 211a is at the same height as the area where the light-emitting element 40 is mounted in some cases, and is at a different height from that area in some other cases. The second surface portion 71a extends in the height direction with respect to the first surface portion 211a. The second surface portion 71a discourages flux, which has entered the inside of the resin portion 30 through the interface between the first lead 21 and the resin portion 30, from reaching the vicinity of the protection element 60.

The protection element 60, the first surface portion 211a and the second surface portion 71a are embedded in the resin portion 30.

As shown in FIG. 1D, the stepped portion 70 having the second surface portion 71a is located on the top surface 21a of the first lead 21 between the protection element 60 and at least one of the lateral portion (i.e., first lateral portion) 21f and the lateral portion (i.e., second lateral portion) 21c. Thus, the distance over which flux moves along the interface between the first lead 21 and the resin portion 30 to reach the protection element 60 is increased by the presence of the second surface portion 71a, making it less likely that flux reaches the protection element 60.

When a metal such as silver that may react with flux is contained in the bonding member 61 connecting the protection element 60 and the first lead 21 and the metal layer 25b located on the top surface of the first lead 21, such a metal may come into contact and react with flux. As a result, the bonding member 61 and the metal layer 25b may undergo an increase in resistance, corrosion or imperfection, or defect in electrical connection. With the light-emitting device 1, however, the second surface portion 71a makes it less likely that flux reaches the protection element 60, and it is therefore possible to maintain a good electrical connection between the protection element 60 and the first lead 21 and to ensure the reliability of the light-emitting device 1 over a longer period of time.

In the present embodiment, the structure (the stepped portion 70) that has the second surface portion and discourages entry of flux, or the like, is a first groove 71 provided on the top surface 21a of the first lead 21. In the present embodiment, the first groove 71 is L-shaped as seen from above, both positioned between the lateral portion 21f and the protection element 60 and between the lateral portion 21c and the protection element 60, both so as to continuously extend in a direction along the respective lateral portions. The first groove 71 may be divided into a groove portion extending between the lateral portion 21f and the protection element 60 and another groove portion extending between the lateral portion 21c and the protection element 60. The first groove 71 has the second surface portion 71a extending in the height direction with respect to the first surface portion 211a where the protection element 60 is mounted. The first lead 21 including the first groove 71 having the second surface portion 71a extends the path between the lateral portion 21f and the protection element 60 and the path between the lateral portion 21c and the protection element 60 along the interface between the first lead 21 and the resin portion 30.

In the embodiment shown in FIG. 2B and FIG. 2C, the second surface portion 71a is substantially perpendicular to the top surface 21a. However, the second surface portion 71a may be a curved surface. The bottom surface of the first groove 71 may be a flat surface or a curved surface.

The first groove 71 may be located on a straight line extending between the protection element 60 and the extension 21h of the lateral portion 21c exposed on the outer lateral surface 10c of the resin package 10, and may be located on the shortest straight line selected from any line extending between the protection element 60 and any point along the boundary between the bottom surface 21b and the lateral portion 21f of the first lead 21 exposed on the bottom surface 10b of the resin package 10. For example, the first groove 71 may include a groove extending in parallel to the boundary between the lateral portion 21c and the top surface 21a excluding the extension 21h, and another groove extending in parallel to the boundary between the lateral portion 21f and the top surface 21a. These two grooves may each have a length of 100 μm or more and 800 μm or less, for example.

Because the second surface portion 71a of the first groove 71 is a surface extending in the height direction with respect to the first surface portion 211a as described above, it is possible to extend the flux path described above and thus to increase the reliability of the light-emitting device 1, as the depth of the first groove 71 is deeper. The depth of the first groove 71 is preferably ½₀ or more and ¾ or less, and more preferably ¹⁄₁₀ or more and ½ or less, of the thickness of the first lead 21. For example, when the thickness of the first lead 21 is 150 µm or more and 250 µm or less, the depth of the first groove 71 is preferably 10 µm or more and 100 µm or less.

The light-emitting device 1 may include at least one second groove 80, each embedded in the resin portion 30, on the top surface 21a of the first lead 21 and the top surface 22a of the second lead 22. The first groove 71 is provided around the protection element 60 in order to discourage flux from entering the protection element 60. On the other hand, as shown in FIG. 1D, one of the second grooves 80 is located outside the first recessed portion 11, as seen from above, in order to discourage flux from entering the first recessed portion 11. The at least one second groove 80 is provided on the top surfaces 21a and 22a, and the at least one second groove 80 in the present embodiment extends along the lateral portions 21c, 21e and 21d of the first lead and the lateral portions 22c, 22f and 22d of the second lead. The first groove 71 and the at least one second groove 80 may be continuous with each other or separate from each other. When the first groove 71 and the at least one second groove 80 are separate from each other, they may be formed by different methods, for example, by forming the at least one second groove 80 with a greater width than that of the first groove 71, and they may be formed in any of various shapes.

As with the stepped portion 70, the at least one second groove 80 having a lateral surface extends the path between the lateral portions and the light-emitting element 40. Accordingly, it is possible to discourage flux possibly entering the device from reaching the inside of the first recessed portion 11 (through the interfaces between the resin portion 30 and the lateral portions 21c, 21e and 21d of the first lead 21 exposed on the bottom surface 10b of the resin package 10, the interfaces between the resin portion 30 and the lateral portions 22c, 22f and 22d of the second lead 22, and the interfaces between the resin portion 30 and the extension 21h of the first lead 21 and the extension 22h of the second lead 22 exposed on the outer lateral surfaces 10c, 10d, 10e and 10f).

a Hence, Flux is less likely to absorb light from the light-emitting element 40 in the first recessed portion 11.

Encapsulant 50

The light-emitting device 1 preferably includes a encapsulant 50. The encapsulant 50 covers the light-emitting element 40 and is located in the first recessed portion 11. The encapsulant 50 protects the light-emitting element 40 from external forces, dust, moisture, etc., and improves the heat resistance, the weather resistance and the light resistance of the light-emitting element 40.

The encapsulant 50 preferably transmits 60% or more, and more preferably 70%, 80% or 90% or more, of the light emitted from the light-emitting element 40. The material of the encapsulant 50 may be a material of the resin used for the resin portion 30, and a thermosetting resin, a thermoplastic resin, or the like, may be used as a base resin, and it may be a silicone resin, an epoxy resin, an acrylic resin, or a resin containing one or more of these, for example. The encapsulant 50 may be formed of a single layer or may be formed of a plurality of layers. The encapsulant 50 may include light scattering particles, such as titanium oxide, silicon oxide, zirconium oxide and aluminum oxide, dispersed therein.

The encapsulant 50 may contain particles of a material that converts the wavelength of light emitted from the light-emitting element 40, for example, a phosphor. Specifically, the phosphor may be cerium-activated yttrium aluminum garnet, cerium-activated lutetium aluminum garnet, europium and/or chromium-activated nitrogen-containing calcium aluminosilicate (calcium may be partially substituted with strontium), europium-activated SiAlON, europium-activated silicate, europium-activated strontium aluminate, manganese-activated potassium fluorosilicate, etc.

The content of the light scattering particles and/or the phosphor is preferably about 10 wt % to 100 wt % with respect to the total weight of the encapsulant 50, for example.

Protection Film

The light-emitting device 1 may include a protection film of silicon oxide, or the like, on the surfaces of the first lead 21 and the second lead 22 and on the surface of the light-emitting element 40. Particularly, when plated silver layers are provided on the surfaces of the first lead 21 and the second lead 22, the surfaces of the plated silver layers can be protected by the protection films to thereby discourage the plated silver layers from being discolored by the sulfur component in the air, or the like. The protection film can be formed by a deposition method using a vacuum process, such as sputtering, for example, or by another known method.

Method for Manufacturing Light-emitting Device

The light-emitting device 1 can be manufactured by the following procedure, for example. First, a lead frame including the metal layer 25b on the surface of the base material 25a is provided. The lead frame includes the first lead 21 having the stepped portion 70 and the second lead 22. Subsequently, the protection element 60 is mounted on the top surface 21a of the first lead 21, and the protection element 60 is electrically connected to the first lead 21 and the second lead 22. Then, using a molding method such as transfer molding, the resin portion 30 is formed to be integral with the first lead 21 and the second lead 22, with the protection element 60 embedded inside the resin portion 30, thus producing a resin-covered lead frame having a plurality of first recessed portions 11 therein. The resin-covered lead frame may be purchased or otherwise obtained. The metal layer 25b may be provided after the formation of the resin portion 30, instead of providing it in advance on the lead frame before the formation of the resin portion 30.

Subsequently, the light-emitting element 40 is mounted in each of the recessed portions of the resin-covered lead frame. The light-emitting elements 40 are flip-chip mounted via a bonding member such as an alloy, of which gold and tin are the major components. Then, encapsulant 50 is provided in each recessed portion so as to cover the light-emitting element 40. Then, the resin-covered lead frame with the light-emitting elements and other members mounted thereon is divided into a plurality of light-emitting devices 1 by using a separation method such as dicing. Thus, the plurality of light-emitting devices 1 are produced.

Advantageous Effects

The light-emitting device 1 has a structure in which the protection element 60 is embedded in the resin portion 30 of the resin package 10. Therefore, there is no need to accommodate the protection element 60 in the first recessed portion 11 of the resin package 10, and it is possible to reduce the size of the opening of the first recessed portion 11. Therefore, it is possible to reduce the light-emitting area of the light-emitting device 1, and make it emit light as if it were a point light source. As a result, the focus of the light emitted from the light-emitting device can be precisely adjusted by using a lens.

On the top surface 21a of the first lead 21, the stepped portion 70 is located between the protection element 60 and at least one of the lateral portion 21f and the lateral portion 21c, and the stepped portion 70 includes the second surface portion 71a extending in the height direction with respect to the first surface portion 211a of the top surface 21a of the first lead 21. Thus, it is possible to extend the path for flux (which may enter the device through at least one of the interface between the lateral portion 21f of the first lead 21 and the resin portion 30 on the bottom surface 10b of the resin package 10 and the interface between the extension 21h of the first lead 21 and the resin portion 30 on the outer lateral surface 10c) to reach the protection element 60. Thus, it is possible to discourage the corrosion of a metal by the flux in the vicinity of the protection element 60, and to maintain a good electrical connection between the protection element 60 and the first lead 21. Therefore, it is possible to provide the light-emitting device 1 having a high reliability.

Variations

The light-emitting device can be realized in various other embodiments. Particularly, the stepped portion 70 may include various other structures as long as it includes the second surface portion 71a extending in the height direction with respect to the first surface portion 211a of the top surface 21a of the first lead 21. The following description will focus on variations of the stepped portion 70.

Figure 4A:
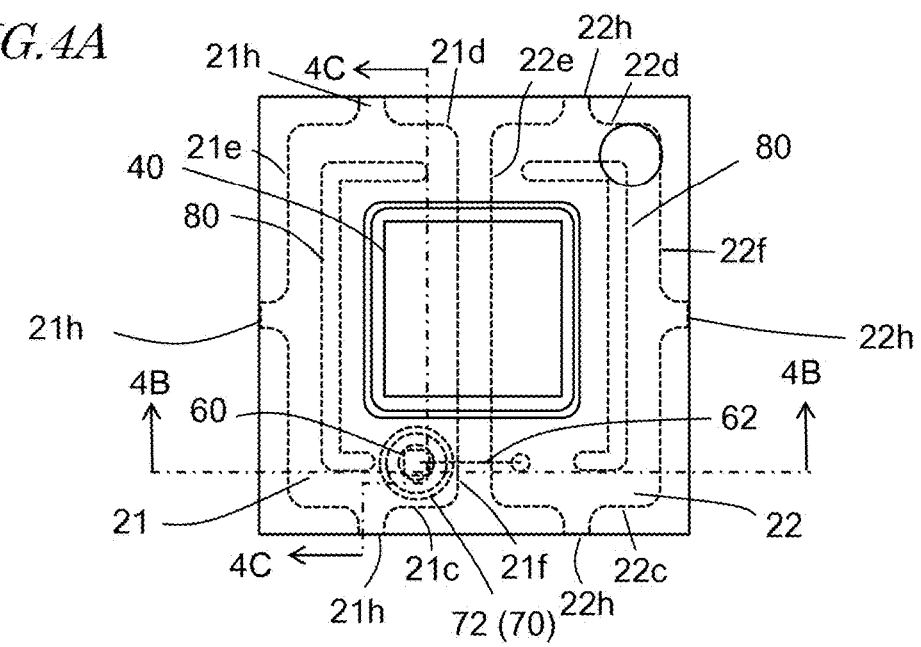
FIG. 4A is a schematic top transparent view of a light-emitting device according to another embodiment of the present disclosure.
Figure 4B:
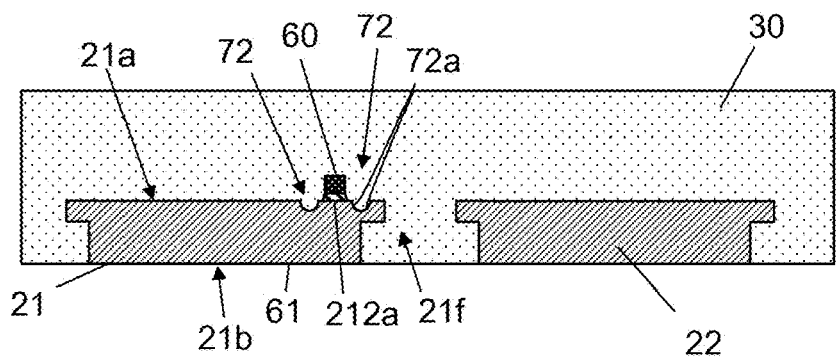
FIG. 4B is a schematic cross-sectional view of the light-emitting device taken along line 4B-4B of FIG. 4A.
Figure 4C:
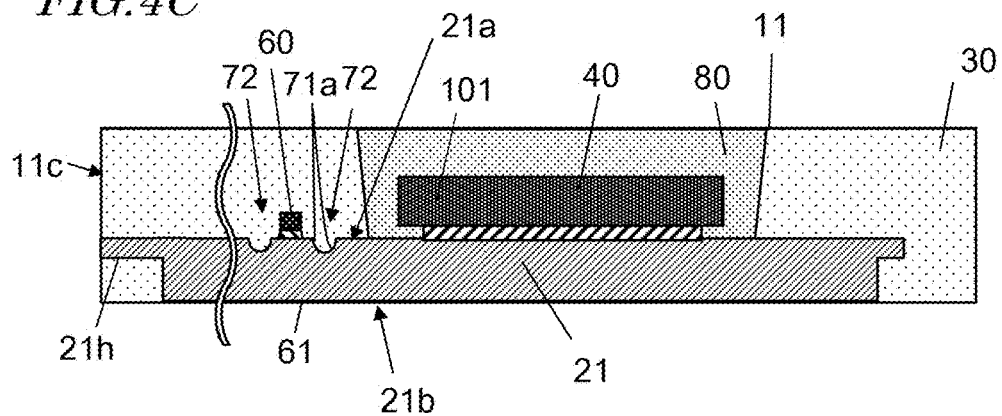
FIG. 4C is a schematic cross-sectional view of the light-emitting device taken along line 4C-4C of FIG. 4A.

FIG. 4A is a schematic top transparent view showing a light-emitting device including another stepped portion 70, and FIG. 4B and FIG. 4C is a schematic cross-sectional view of the light-emitting device taken along line 4B-4B and line 4C-4C of FIG. 4A.

The light-emitting device shown in FIG. 4A includes, as the stepped portion 70, a ring-shaped groove 72 located on the top surface 21a of the first lead 21 and surrounding the protection element 60, as seen from above. The groove 72 is embedded in the resin portion 30. As shown in FIG. 4A, in this embodiment, the groove 72 extends continuously around the protection element 60. Thus, the groove 72 is located both between a lateral portion (first lateral portion) 21f and the protection element 60 and between another lateral portion (second lateral portion) 21c and the protection element 60. The groove 72 may be partially absent on the sides of the lateral portions 21e and 21d, for example. The groove 72 has a second surface portion 72a extending in the height direction with respect to a first surface portion 212a where the protection element 60 is mounted. The second surface portion 72a in this embodiment is a curved surface.

The groove 72 having such a structure can also make it unlikely that flux reaches the vicinity of the protection element 60 as described above in the embodiment above, thereby discouraging the corrosion of a metal by the flux in the vicinity of the protection element 60.

Figure 5A:
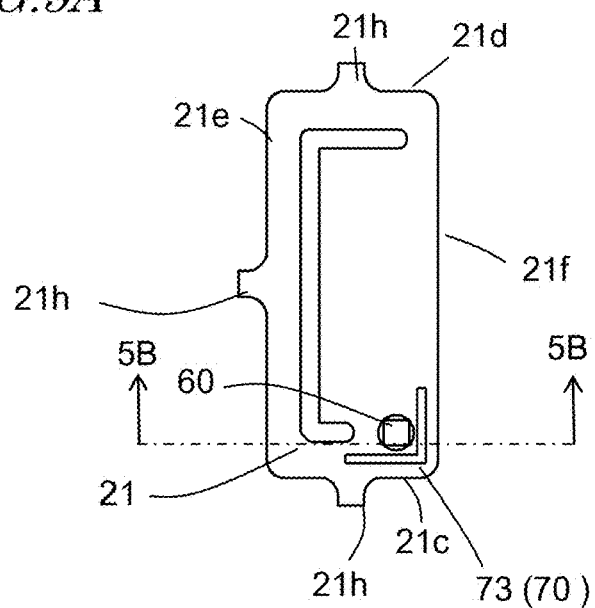
FIG. 5A is a schematic top view of another first lead of the present disclosure.
Figure 5B:
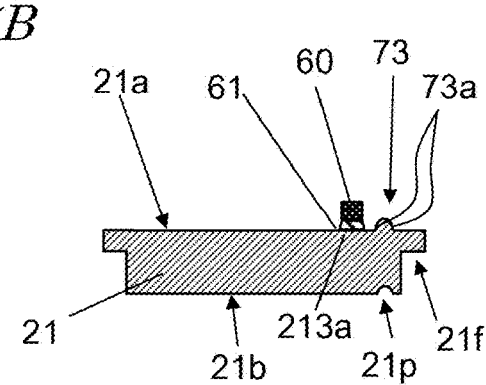
FIG. 5B is a schematic cross-sectional view of the first lead taken along line 5B-5B of FIG. 5A.
Figure 5C:
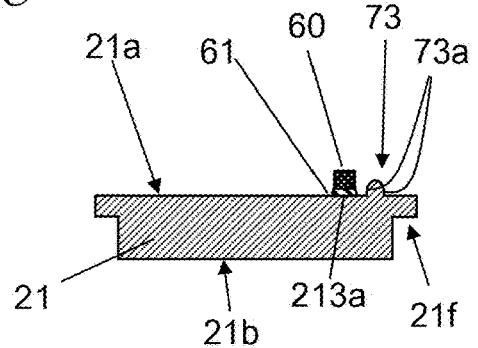
FIG. 5C is another schematic cross-sectional view of the first lead taken along line 5B-5B of FIG. 5A.

FIG. 5A is a schematic top view showing the first lead 21 of a light-emitting device including another stepped portion 70 and the protection element 60 mounted on the first lead 21, and FIG. 5B and FIG. 5C are schematic cross-sectional views of the light-emitting device taken along line 5B-5B of FIG. 5A.

As shown in FIG. 5A to FIG. 5C, the stepped portion 70 may be a first protrusion 73 located on the top surface 21a of the first lead 21, and protruding from the top surface 21a. The first protrusion 73 is located both between a lateral portion (first lateral portion) 21f and the protection element 60 and between another lateral portion (second lateral portion) 21c and the protection element 60, and is substantially L-shaped, as seen from above. The first protrusion 73 has a length that is about equal to or greater than the width of the protection element 60 in the direction along the lateral portion 21c and in the direction along the lateral portion 21f. The first protrusion 73 has a second surface portion 73a extending in the height direction with respect to a first surface portion 213a where the protection element 60 is mounted. The height of the first protrusion 73 may be about the same as the depth of the first groove 71 of the embodiment described above, for example. The length of the first protrusion 73 as seen from above may be about the same as that of the first groove 71. The first protrusion 73 is of the same material as the first lead 21. The first protrusion 73 is embedded in the resin portion 30.

The first protrusion 73 having such a structure can also make it unlikely that flux reaches the vicinity of the protection element 60 as described in the embodiment above, thereby discouraging the corrosion of a metal by the flux in the vicinity of the protection element 60.

The first protrusion 73 can be formed on the top surface 21a of the first lead 21 by a pressing process, for example. In such a case, a groove 21p corresponding to the first protrusion 73 is formed at the same time on the bottom surface 21b, as shown in FIG. 5B.

The first protrusion 73 may be formed by an etching process. For example, a mask corresponding to the first protrusion 73 can be formed on the top surface 21a of the first lead 21, and an area of the top surface 21a of the first lead 21 excluding the first protrusion 73 can be etched away by using the mask, thereby forming the first protrusion 73.

Figure 6A:
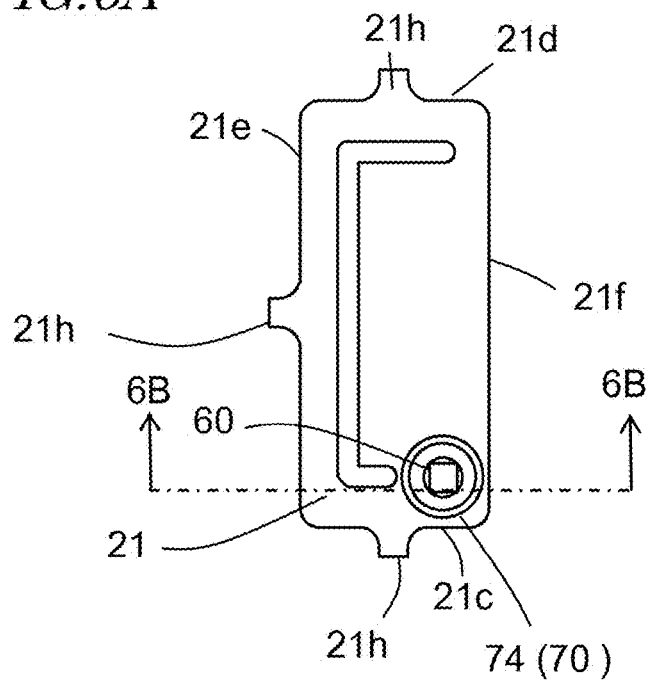
FIG. 6A is a schematic top view of still another first lead of the present disclosure.
Figure 6B:
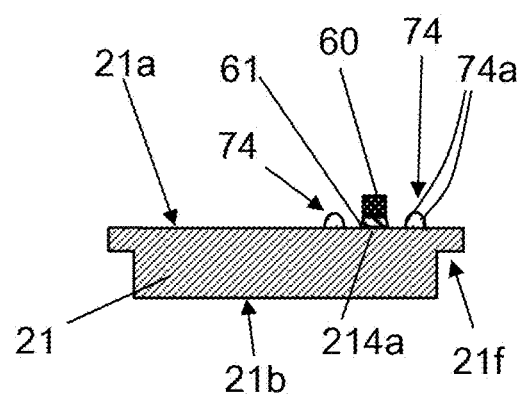
FIG. 6B is a schematic cross-sectional view of the first lead taken along line 6B-6B of FIG. 6A.

FIG. 6A is a schematic top view showing the first lead 21 of a light-emitting device including another stepped portion 70 and the protection element 60 mounted on the first lead 21. FIG. 6B is a schematic cross-sectional view of the first lead 21 and the protection element 60 taken along line 6B-6B of FIG. 6A.

As shown in FIG. 6A and FIG. 6B, the stepped portion 70 is a first protrusion 74 located on the top surface 21a of the first lead 21 and having a ring shape surrounding the protection element 60, as seen from above. As shown in FIG. 6A, in this embodiment, the first protrusion 74 extends continuously around the protection element 60. Thus, the first protrusion 74 is located both between a lateral portion (first lateral portion) 21f and the protection element 60 and between another lateral portion (second lateral portion) 21c and the protection element 60. The first protrusion 74 may be partially absent on the sides of the lateral portions 21e and 21d, for example. The first protrusion 74 has a second surface portion 74a extending in the height direction with respect to a first surface portion 214a where the protection element 60 is mounted, and the second surface portion 74a in this embodiment is a curved surface. The first protrusion 74 is formed of a material such as a resin, for example. The first protrusion 74 is covered by, and embedded in, the resin portion 30. The material of the first protrusion 74 preferably has a better adhesion with the first lead 21 than with the resin portion 30. That is, the first protrusion 74 may be formed of a material that is different from the resin portion 30. For example, the material of the first protrusion 74 may be one that is different from the material used for the resin portion 30 among the materials listed for the resin portion 30. In such a case, the material used for the first protrusion 74 does not need to contain a light-reflecting substance.

The first protrusion 74 having such a structure can also make it unlikely that flux reaches the vicinity of the protection element 60 as described in the embodiment above, thereby discouraging the corrosion of a metal by the flux in the vicinity of the protection element 60.

Figure 7A:
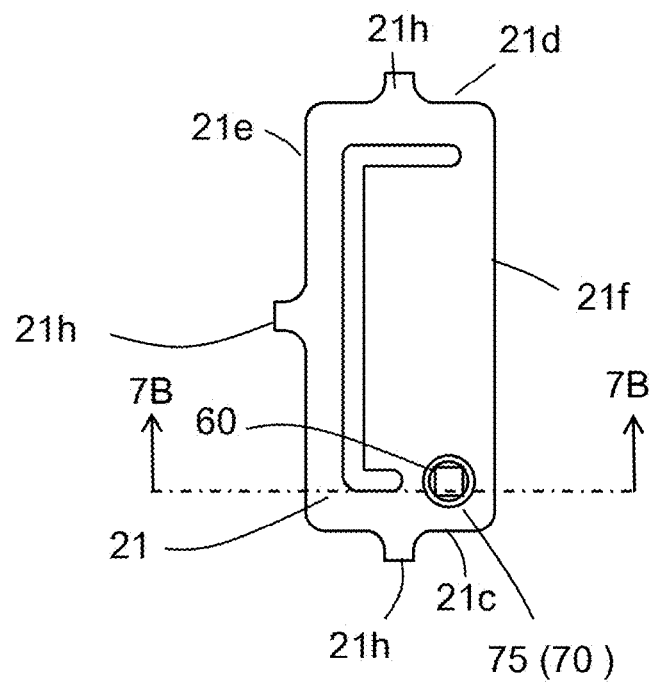
FIG. 7A is a schematic top view of still another first lead of the present disclosure.
Figure 7B:
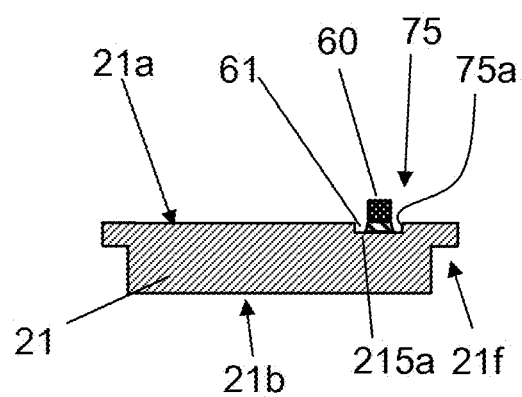
FIG. 7B is a schematic cross-sectional view of the first lead taken along line 7B-7B of FIG. 7A.

FIG. 7A is a schematic top view showing the first lead 21 of a light-emitting device including still another stepped portion 70 and the protection element 60 mounted on the first lead 21. FIG. 7B is a schematic cross-sectional view of the first lead 21 and the protection element 60 taken alone line 7B-7B of FIG. 7A.

As shown in FIG. 7A and FIG. 7B, a second recessed portion 75 located on the top surface 21a of the first lead 21 serves as a stepped portion 70. The protection element 60 is located on the bottom surface (a first surface portion 215a) of the second recessed portion 75 via the bonding member 61. Therefore, a second surface portion 75a surrounds the protection element 60, as seen from above, and is located both between a lateral portion (first lateral portion) 21f and the protection element 60 and between another lateral portion (second lateral portion) 21c and the protection element 60. The second recessed portion 75 is filled with the resin portion 30. The second surface portion 75a extends in the height direction with respect to the first surface portion 215a of the top surface 21a of the first lead 21, and is a curved surface in this embodiment.

The second recessed portion 75 having such a structure can also make it unlikely that flux reaches the vicinity of the protection element 60 as described in the embodiment above, thereby discouraging the corrosion of a metal by the flux in the vicinity of the protection element 60.

Figure 8A:
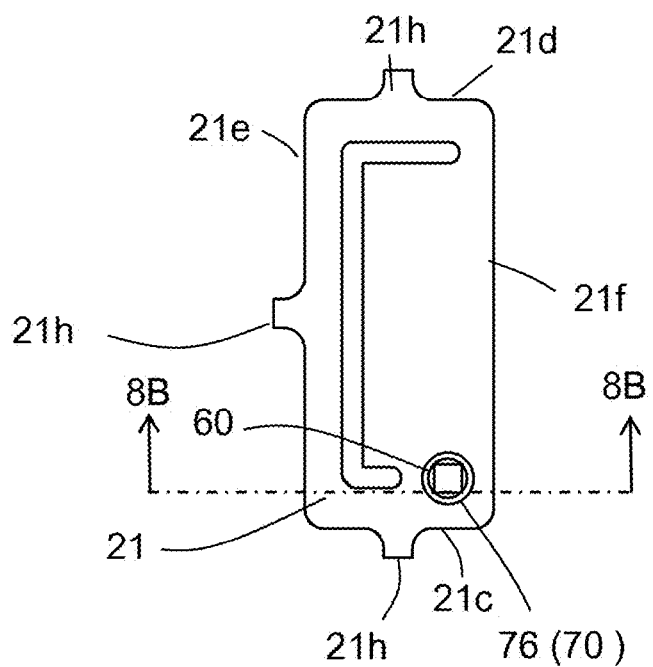
FIG. 8A is a schematic top view of still another first lead of the present disclosure.
Figure 8B:
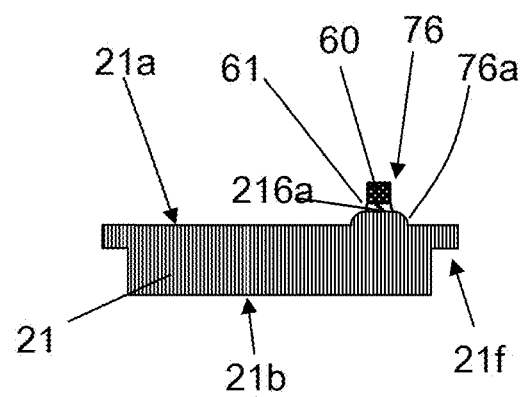
FIG. 8B is a schematic cross-sectional view of the first lead taken along line 8B-8B of FIG. 8A.

FIG. 8A is a schematic top view showing the first lead 21 of a light-emitting device including still another stepped portion 70 and the protection element 60 mounted on the first lead 21. FIG. 8B is a schematic cross-sectional view of the first lead 21 and the protection element 60 taken along line 8B-8B of FIG. 8A.

As shown in FIG. 8A and FIG. 8B, a second protrusion 76 located on the top surface 21a of the first lead 21 serves as the stepped portion 70. The protection element 60 is located on the top surface (i.e., a first surface portion 216a) of the second protrusion 76 via the bonding member 61. Therefore, a second surface portion 76a surrounds the protection element 60, as seen from above, and is located both between a lateral portion (i.e., first lateral portion) 21f and the protection element 60 and between another lateral portion (i.e., second lateral portion) 21c and the protection element 60. The protection element 60 and the second protrusion 76 are entirely embedded in the resin portion 30. The second surface portion 76a extends in the height direction with respect to the first surface portion 216a of the top surface 21a of the first lead 21, and is a curved surface in this embodiment. The method for forming the second protrusion 76 may be, for example, a method such as a pressing process, an etching process, and the like, as described above.

The second protrusion 76 having such a structure can also make it unlikely that flux reaches the vicinity of the protection element 60 as described in the embodiment above, thereby discouraging the corrosion of a metal by the flux in the vicinity of the protection element 60.

Figure 9A:
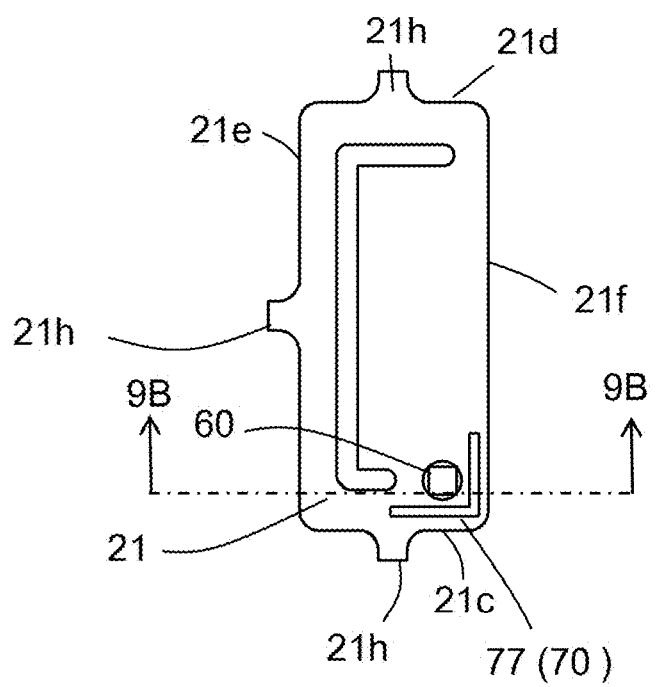
FIG. 9A is a schematic top view of still another first lead of the present disclosure.
Figure 9B:
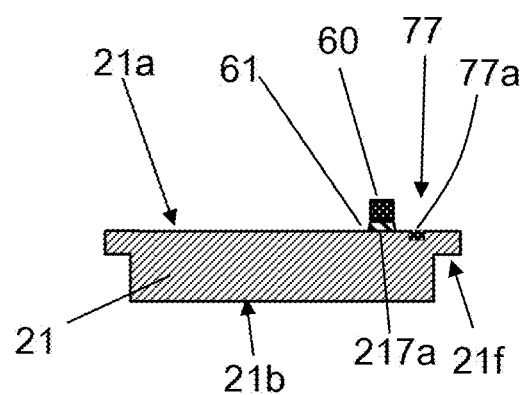
FIG. 9B is a schematic cross-sectional view of the first lead taken along 9B-9B of FIG. 9A.

FIG. 9A is a schematic top view showing the first lead 21 of a light-emitting device including still another stepped portion 70 and the protection element 60 mounted on the first lead 21. FIG. 9B is a schematic cross-sectional view of the first lead 21 having the protection element 60 thereon taken along line 9B-9B of FIG. 9A.

As shown in FIG. 9A and FIG. 9B, the stepped portion 70 may be a rough surface portion 77 provided and located on the top surface 21a of the first lead 21. The rough surface portion 77 is located both between a lateral portion (i.e., first lateral portion) 21f and the protection element 60 and between another lateral portion (i.e., second lateral portion) 21c and the protection element 60, and is substantially L-shaped as seen from above. The rough surface portion 77 includes a plurality of minute irregularities, and the lateral surface portions of the irregularities define a second surface portion 77a extending in the height direction with respect to a first surface portion 217a of the top surface 21a of the first lead 21. The rough surface portion 77 preferably has a surface roughness (arithmetic average roughness Ra) of 0.1 μm or more and 10 μm or less, for example. The width of the rough surface portion 77 is preferably 50 μm or more and 600 μm or less, for example. The rough surface portion 77 can be formed by a blast process, a laser process, an etching process, or the like, for example.

The depth of each depression and the height of each protrusion of the rough surface portion 77 are small. However, as a plurality of depressions and protrusions are formed in the rough surface portion 77, it is possible to extend the path to the protection element 60 to an extent that it is possible to improve the reliability of the light-emitting device. Therefore, the rough surface portion 77 having such a structure can also make it unlikely that flux reaches the vicinity of the protection element 60 as described in the embodiment above, thereby discouraging the corrosion of a metal by the flux in the vicinity of the protection element 60.

Figure 10A:
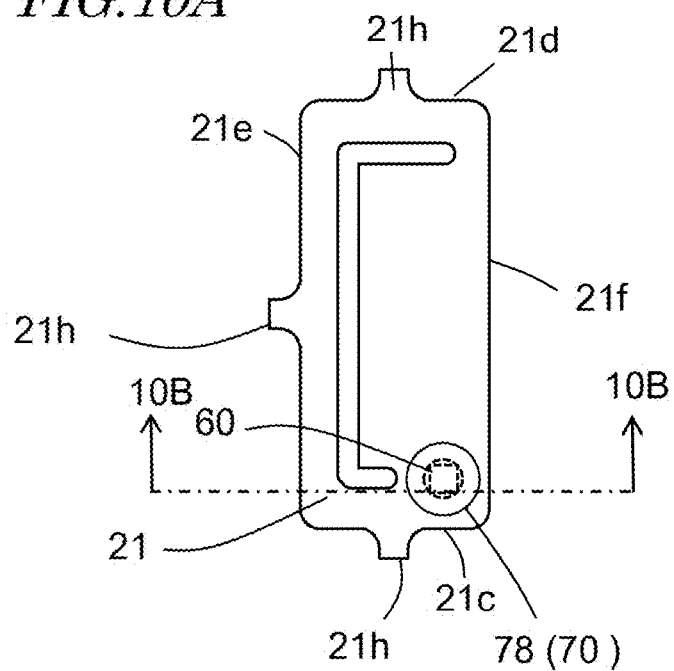
FIG. 10A is a schematic top view of still another first lead of the present disclosure.
Figure 10B:
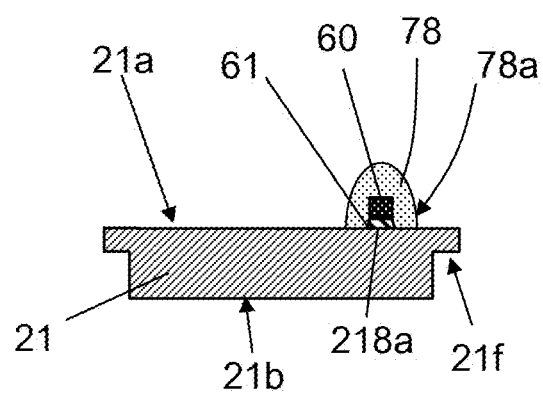
FIG. 10B is a schematic cross-sectional view of the first lead taken along line 9B-9B of 10A.

FIG. 10A is a schematic top view showing the first lead 21 of a light-emitting device including still another stepped portion 70 and the protection element 60 mounted on the first lead 21 FIG. 10B is a schematic cross-sectional view of the first lead 21 having the protection element 60 thereon taken along line 10B-10B of FIG. 10A.

As shown in FIG. 10A and FIG. 10B, the stepped portion 70 may be a cover portion 78 that is provided and located on the top surface 21a of the first lead 21. The cover portion 78 is located on the top surface 21a of the first lead 21 covering the entire protection element 60. A second surface portion 78a of the cover portion 78 is located both between a lateral portion (first lateral portion) 21f and the protection element 60 and between another lateral portion (second lateral portion) 21c and the protection element 60, and the second surface portion 78a extends in the height direction with respect to a first surface portion 218a. The cover portion 78 is preferably of a material that is different from the resin portion 30, and is preferably of a material that has a better adhesion with the first lead 21 than with the material of the resin portion 30. For example, as with the first protrusion 74, the material of the cover portion 78 may be one that is different from the material used for the resin portion 30 among the materials listed for the resin portion 30. In such a case, the material used for the cover portion 78 does not need to contain a light-reflecting substance.

In FIG. 10B, the cover portion 78 covers the entire protection element 60. In such a case, it is preferred that the entire protection element 60 is covered by the cover portion 78 after the wire 62 (shown in FIG. 1C) is connected to the protection element 60. The cover portion 78 may be provided so that the top surface of the protection element 60, which is a terminal thereof, is exposed. In such a case, the cover portion 78 may be provided so that the top surface of the protection element 60 is exposed after the protection element 60 is connected to the first lead 21 via the bonding member 61. The wire 62 (shown in FIG. 1C) may be connected to the top surface after the formation of the cover portion 78.

The cover portion 78 having such a structure can also make it unlikely that flux reaches the vicinity of the protection element 60 as described in the embodiment above, thereby discouraging the corrosion of a metal by the flux in the vicinity of the protection element 60.

As can be seen from the description of the embodiment above and other embodiments, a light-emitting device of the present disclosure may include the second surface portion, as any of various structures or a portion thereof, provided between the protection element 60 and at least one of the lateral portion 21*f* and the lateral portion 21*c*, and the structure of the second surface portion can be appropriately selected from other than those described in the embodiment above and other embodiments.

Although the stepped portion 70 has a single shape in the embodiment described above, the light-emitting device may have any combination of the structures described above as the stepped portion 70. There may be a plurality of stepped portions 70 provided between the protection element 60 and at least one of the lateral portion 21*f* and the lateral portion 21*c*. For example, there may be a plurality of first grooves 71 or first protrusions 73 or 74, etc., provided on the top surface 21*a* of the first lead 21. The second recessed portion 75 and the second protrusion 76 may be provided together with each other. For example, the second protrusion 76 may be located in the second recessed portion 75, or the second recessed portion 75 may be provided on the second protrusion 76.

Figure 3A:
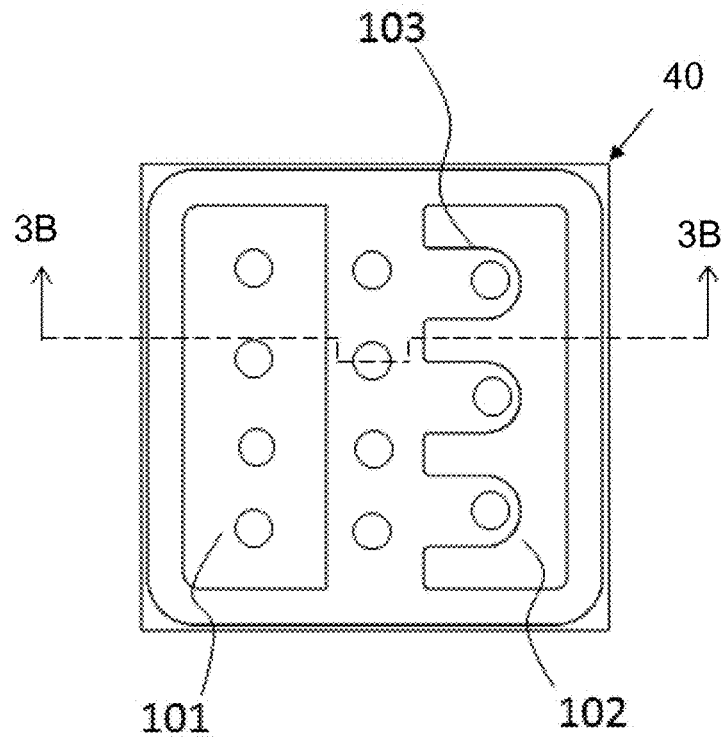
FIG. 3A is a schematic top view showing a light-emitting element of the light-emitting device.
Figure 3B:
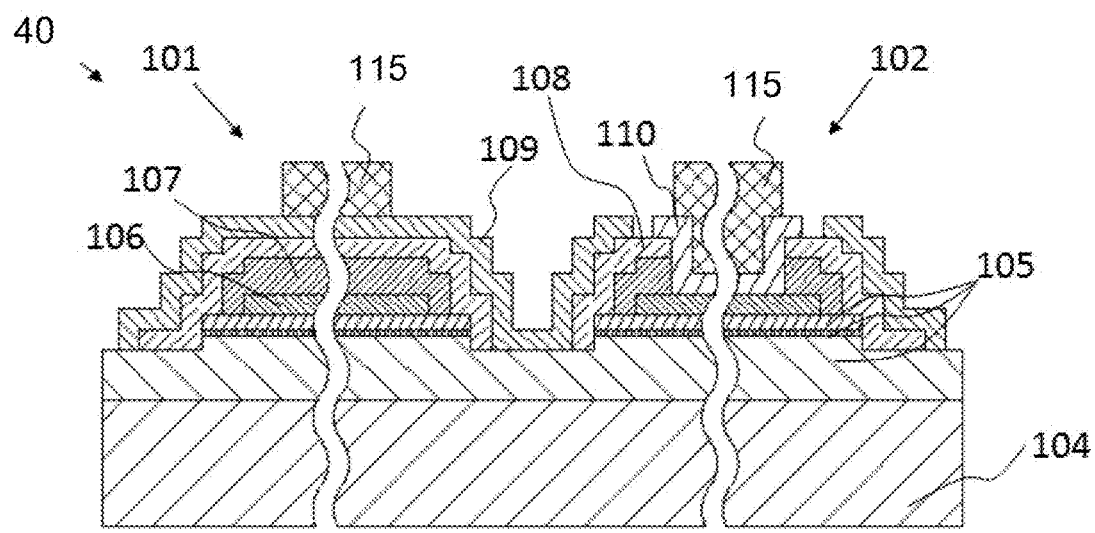
FIG. 3B is a schematic cross-sectional view of the light-emitting element taken along line 3B-3B of FIG. 3A.

In the embodiment described above, the light-emitting element 40 includes a structure shown in FIG. 3A and FIG. 3B. However, the light-emitting element 40 may be a light-emitting element having an ordinary structure that can be flip-chip mounted, other than the one having a structure shown in these figures.

While exemplary embodiment of the present invention have been described, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device comprising:
   a resin package comprising:
     a first lead,
     a second lead, and
     a resin portion,
     wherein each of the first lead and the second lead has a top surface and a bottom surface and comprises a metal layer formed at least at the top surfaces,
     wherein the first lead, the second lead, and the resin portion together define a first recessed portion,
     wherein a part of the top surface of the first lead and a part of the top surface of the second lead are exposed at a bottom of the first recessed portion, and
     wherein a part of the bottom surface of the first lead and a part of the bottom surface of the second lead are exposed from the resin portion;
   a light-emitting element located in the first recessed portion of the resin package, the light-emitting element being electrically connected to the first lead and the second lead; and
   a protection element embedded in the resin portion and located on a first surface portion of the top surface of the first lead;
   wherein the first lead comprises:
     a first lateral portion located on a side that is adjacent to the second lead, and
     a second lateral portion, at least a part of which is exposed from the resin portion at a lateral surface of the resin package;
   wherein the first lead includes (i) a second recessed portion located in the top surface of the first lead and embedded in the resin portion, or (ii) a protrusion located at the top surface of the first lead and embedded in the resin portion; and
   wherein the protection element is located on (i) a surface defining a bottom of the second recessed portion, or (ii) a top surface of the protrusion.

2. The light-emitting device according to claim 1, wherein:
   the first lead includes the second recessed portion located in the top surface of the first lead and embedded in the resin portion; and
   the protection element is located on the surface defining the bottom of the second recessed portion.

3. The light-emitting device according to claim 1, wherein:
   the first lead includes the protrusion located at the top surface of the first lead and embedded in the resin portion; and
   the protection element is located on the top surface of the protrusion.

4. The light-emitting device according to claim 1, wherein each of the first lead and the second lead includes an edge groove located along the first lateral portion and the second lateral portion in the bottom surface.

5. The light-emitting device according to claim 1, wherein each of the first lead and the second lead includes at least one groove on its top surface, the at least one groove being embedded in the resin portion and located outside the first recessed portion in a top view.

6. The light-emitting device according to claim 1, wherein the protection element is connected to the top surface of the first lead via a silver-containing material.

7. A light-emitting device comprising:
   a resin package comprising:
     a first lead,
     a second lead, and
     a resin portion,
     wherein each of the first lead and the second lead has a top surface and a bottom surface and comprises a metal layer formed at least at the top surfaces,
     wherein the first lead, the second lead, and the resin portion together define a first recessed portion,
     wherein a part of the top surface of the first lead and a part of the top surface of the second lead are exposed at a bottom of the first recessed portion, and
     wherein a part of the bottom surface of the first lead and a part of the bottom surface of the second lead are exposed from the resin portion;
   a light-emitting element located in the first recessed portion of the resin package, the light-emitting element being electrically connected to the first lead and the second lead; and
   a protection element embedded in the resin portion and located on a first surface portion of the top surface of the first lead;
   wherein the first lead comprises:
     a first lateral portion located on a side that is adjacent to the second lead, and
     a second lateral portion, at least a part of which is exposed from the resin portion at a lateral surface of the resin package;

wherein a groove is formed in the top surface of the first lead, the groove being embedded in the resin portion; and wherein the groove is L-shaped in a top view and includes a first groove portion located between the first lateral portion and the protection element, and a second groove portion that is continuous with the first groove portion and is located between the second lateral portion and the protection element.

8. A light-emitting device comprising:
a resin package comprising:
  a first lead,
  a second lead, and
  a resin portion,
    wherein each of the first lead and the second lead has a top surface and a bottom surface and comprises a metal layer formed at least at the top surfaces,
    wherein the first lead, the second lead, and the resin portion together define a first recessed portion,
    wherein a part of the top surface of the first lead and a part of the top surface of the second lead are exposed at a bottom of the first recessed portion, and
    wherein a part of the bottom surface of the first lead and a part of the bottom surface of the second lead are exposed from the resin portion;
a light-emitting element located in the first recessed portion of the resin package, the light-emitting element being electrically connected to the first lead and the second lead; and
a protection element embedded in the resin portion and located on a first surface portion of the top surface of the first lead;
wherein the first lead comprises:
  a first lateral portion located on a side that is adjacent to the second lead, and
  a second lateral portion, at least a part of which is exposed from the resin portion at a lateral surface of the resin package;
wherein a rough surface portion is formed at the top surface of the first lead, the rough surface portion being embedded in the resin portion; and
wherein the rough surface portion is L-shaped in a top view and includes a first rough surface portion located between the first lateral portion and the protection element, and a second rough surface portion that is continuous with the first rough surface portion and is located between the second lateral portion and the protection element.

9. A light-emitting device comprising:
a resin package comprising:
  a first lead,
  a second lead, and
  a resin portion,
    wherein each of the first lead and the second lead has a top surface and a bottom surface and comprises a metal layer formed at least at the top surfaces,
    wherein the first lead, the second lead, and the resin portion together define a first recessed portion,
    wherein a part of the top surface of the first lead and a part of the top surface of the second lead are exposed at a bottom of the first recessed portion, and
    wherein a part of the bottom surface of the first lead and a part of the bottom surface of the second lead are exposed from the resin portion;
a light-emitting element located in the first recessed portion of the resin package, the light-emitting element being electrically connected to the first lead and the second lead; and
a protection element embedded in the resin portion and located on a first surface portion of the top surface of the first lead;
wherein the first lead comprises:
  a first lateral portion located on a side that is adjacent to the second lead, and
  a second lateral portion, at least a part of which is exposed from the resin portion at a lateral surface of the resin package;
wherein (i) a groove is formed in the top surface of the first lead, is embedded in the resin portion, and entirely surrounds the protection element in a top view, or (ii) a protrusion is located at the top surface of the first lead, is embedded in the resin portion, and entirely surrounds the protection element in a top view.

10. The light-emitting device according to claim 9, wherein:
the groove is formed in the top surface of the first lead, is embedded in the resin portion, and entirely surrounds the protection element in the top view.

11. The light-emitting device according to claim 9, wherein:
the protrusion is located at the top surface of the first lead, is embedded in the resin portion, and entirely surrounds the protection element in the top view.

12. The light-emitting device according to claim 11, wherein the protrusion is formed of the same material as the first lead.

13. The light-emitting device according to claim 11, wherein the protrusion is formed of a material different from the first lead.

14. A light-emitting device comprising:
a resin package comprising:
  a first lead,
  a second lead, and
  a resin portion,
    wherein each of the first lead and the second lead has a top surface and a bottom surface and comprises a metal layer formed at least at the top surfaces,
    wherein the first lead, the second lead, and the resin portion together define a first recessed portion,
    wherein a part of the top surface of the first lead and a part of the top surface of the second lead are exposed at a bottom of the first recessed portion, and
    wherein a part of the bottom surface of the first lead and a part of the bottom surface of the second lead are exposed from the resin portion;
a light-emitting element located in the first recessed portion of the resin package, the light-emitting element being electrically connected to the first lead and the second lead; and
a protection element embedded in the resin portion and located on a first surface portion of the top surface of the first lead;
wherein the first lead comprises:
  a first lateral portion located on a side that is adjacent to the second lead, and
  a second lateral portion, at least a part of which is exposed from the resin portion at a lateral surface of the resin package;
wherein a protrusion is formed in the top surface of the first lead, the protrusion being embedded in the resin portion; and wherein the protrusion is L-shaped in a top view and includes a first protrusion portion located between the first lateral portion and the protection element, and a second protrusion portion that is continuous with the first protrusion portion and is located between the second lateral portion and the protection element.

* * * * *